United States Patent
Wu et al.

(10) Patent No.: US 12,295,123 B2
(45) Date of Patent: May 6, 2025

(54) LIQUID COOLING PLATE ASSEMBLY AND SERVER

(71) Applicants: INVENTEC (PUDONG) TECHNOLOGY CORPORATION, Shanghai (CN); INVENTEC CORPORATION, Taipei (TW)

(72) Inventors: Jiang-jun Wu, Shanghai (CN); Jingnan Zhao, Shanghai (CN); Peng Yu, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 218 days.

(21) Appl. No.: 18/209,998

(22) Filed: Jun. 14, 2023

(65) Prior Publication Data

US 2024/0414890 A1     Dec. 12, 2024

(30) Foreign Application Priority Data

Jun. 8, 2023  (CN) .......................... 202310678342.8

(51) Int. Cl.
  *H05K 7/20* (2006.01)
  *H01L 23/473* (2006.01)

(52) U.S. Cl.
  CPC ....... *H05K 7/20772* (2013.01); *H01L 23/473* (2013.01); *H05K 7/20254* (2013.01)

(58) Field of Classification Search
  CPC ............ H05K 7/20254; H05K 7/20772; H01L 23/473
  See application file for complete search history.

(56) References Cited

U.S. PATENT DOCUMENTS

| | | | | |
|---|---|---|---|---|
| 7,400,505 B2* | 7/2008 | Campbell | .......... | H05K 7/20772 174/15.1 |
| 7,405,936 B1* | 7/2008 | Campbell | .......... | H05K 7/20554 361/699 |
| 7,420,804 B2* | 9/2008 | Leija | .................. | H05K 7/20772 361/679.48 |
| 8,644,021 B2* | 2/2014 | Chen | .................. | H05K 7/20809 361/689 |
| 9,370,122 B2* | 6/2016 | Chainer | .................. | G06F 3/044 |
| 10,448,545 B2* | 10/2019 | Lim | .................... | H01M 10/625 |
| 11,157,050 B1* | 10/2021 | Lunsman | ........... | H05K 7/20509 |

(Continued)

*Primary Examiner* — Robert J Hoffberg
(74) *Attorney, Agent, or Firm* — Maschoff Brennan

(57) ABSTRACT

A liquid cooling plate assembly includes a first liquid cooling plate, a second liquid cooling plate, a first connection tube and a second connection tube. The first liquid cooling plate includes a first heat dissipation part and a second heat dissipation part connected to each other. The first heat dissipation part has a first fluid chamber. The second heat dissipation part has a first fluid channel. The second liquid cooling plate includes a third heat dissipation part and a fourth heat dissipation part connected to each other. The third heat dissipation part has a second fluid chamber. The fourth heat dissipation part has a second fluid channel in fluid communication with the second fluid chamber. The first connection tube communicates the second fluid chamber with the first fluid chamber. The second connection tube communicates the second fluid channel with the first fluid channel.

10 Claims, 3 Drawing Sheets

(56) References Cited

U.S. PATENT DOCUMENTS

2024/0365507 A1* 10/2024 Li .................. H05K 7/20927
2024/0414879 A1* 12/2024 Wu ...................... H05K 7/20
2025/0081391 A1*  3/2025 Zhao ............... H05K 7/20263

* cited by examiner

LIQUID COOLING PLATE ASSEMBLY AND SERVER

CROSS-REFERENCE TO RELATED APPLICATIONS

This non-provisional application claims priority under 35 U.S.C. § 119 (a) on Patent Application No(s). 202310678342.8 filed in China, Jun. 8, 2023, the entire contents of which are hereby incorporated by reference.

BACKGROUND OF THE INVENTION

Technical Field of the Invention

The invention relates a liquid cooling plate assembly and a server.

Description of the Related Art

In general, a motherboard of a server not only has a central processing unit (i.e., CPU), but also is provided with a plurality of voltage regulator chips (i.e., VR chips) to adjust loading voltage for the operation of CPU. The CPU is cooled by a cooling plate, and the VR chips are cooled by heat dissipation fins in combination with a passive or active air cooling means. However, as the performances of the VR chips are improved, the VR chips generate more heat, and thus the conventional heat dissipation fins in combination with the passive or active air cooling means are insufficient to effectively and efficiently dissipate heat generated by the VR chips. Therefore, how to solve the aforementioned issue is one of the topics in this field.

SUMMARY OF THE INVENTION

The invention provides a liquid cooling plate assembly and a server which enable the VR chips to be effectively and efficiently cooled.

One embodiment of the invention provides a liquid cooling plate assembly. The liquid cooling plate assembly is configured to be in thermal contact with two first heat sources and a plurality of second heat sources. The liquid cooling plate assembly includes a first liquid cooling plate, a second liquid cooling plate, a first connection tube and at least one second connection tube. The first liquid cooling plate includes a first heat dissipation part and at least one second heat dissipation part. The first heat dissipation part is configured to be in thermal contact with one of the two first heat sources and has a first fluid chamber. The second heat dissipation part is connected to the first heat dissipation part and configured to be in thermal contact with some of the second heat sources. The second heat dissipation part has a first fluid channel. The second liquid cooling plate includes a third heat dissipation part and at least one fourth heat dissipation part. The third heat dissipation part is configured to be in thermal contact with the other one of the first heat sources and has a second fluid chamber. The fourth heat dissipation part is connected to the third heat dissipation part and configured to be in thermal contact with others of the second heat sources. The fourth heat dissipation part has a second fluid channel, and the second fluid channel is in fluid communication with the second fluid chamber. The first connection tube is connected to the third heat dissipation part and the first heat dissipation part so as to communicate the second fluid chamber with the first fluid chamber. The second connection tube is connected to the fourth heat dissipation part and the second heat dissipation part so as to communicate the second fluid channel with the first fluid channel.

Another embodiment of the invention provides a server. The server includes a casing, a motherboard and a liquid cooling plate assembly. The casing has an accommodation space. The motherboard is located in the accommodation space and has two first heat sources and a plurality of second heat sources. The liquid cooling plate assembly includes a first liquid cooling plate, a second liquid cooling plate, a first connection tube and at least one second connection tube. The first liquid cooling plate includes a first heat dissipation part and at least one second heat dissipation part. The first heat dissipation part is in thermal contact with one of the two first heat sources and has a first fluid chamber. The second heat dissipation part is connected to the first heat dissipation part and in thermal contact with some of the second heat sources. The second heat dissipation part has a first fluid channel. The second liquid cooling plate includes a third heat dissipation part and at least one fourth heat dissipation part. The third heat dissipation part is in thermal contact with the other one of the first heat sources and has a second fluid chamber. The fourth heat dissipation part is connected to the third heat dissipation part and in thermal contact with others of the second heat sources. The fourth heat dissipation part has a second fluid channel, and the second fluid channel is in fluid communication with the second fluid chamber. The first connection tube is connected to the third heat dissipation part and the first heat dissipation part so as to communicate the second fluid chamber with the first fluid chamber. The second connection tube is connected to the fourth heat dissipation part and the second heat dissipation part so as to communicate the second fluid channel with the first fluid channel.

According to the liquid cooling plate assembly and the server as discussed in the above embodiments, the coolant can flow through the first fluid chamber of the first heat dissipation part of the first liquid cooling plate, the second fluid chamber of the third heat dissipation part of the second liquid cooling plate, the second fluid channel of the fourth heat dissipation part of the second liquid cooling plate, and the first fluid channel of the second heat dissipation part of the first liquid cooling plate, such that the coolant can perform heat exchange with the first heat dissipation part and the second heat dissipation part which are respectively in thermal contact with the first heat sources so as to take away the heat generated by the first heat sources, and the coolant can perform heat exchange with the second heat dissipation part and the fourth heat dissipation part which are in thermal contact with the second heat sources so as to take away the heat generated by the second heat sources. As a result, the liquid cooling plate assembly can effectively and efficiently perform heat dissipation to the first heat sources and the second heat sources so as to achieve the heat dissipation requirements of the first heat sources and the second heat sources.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

Figure 1:
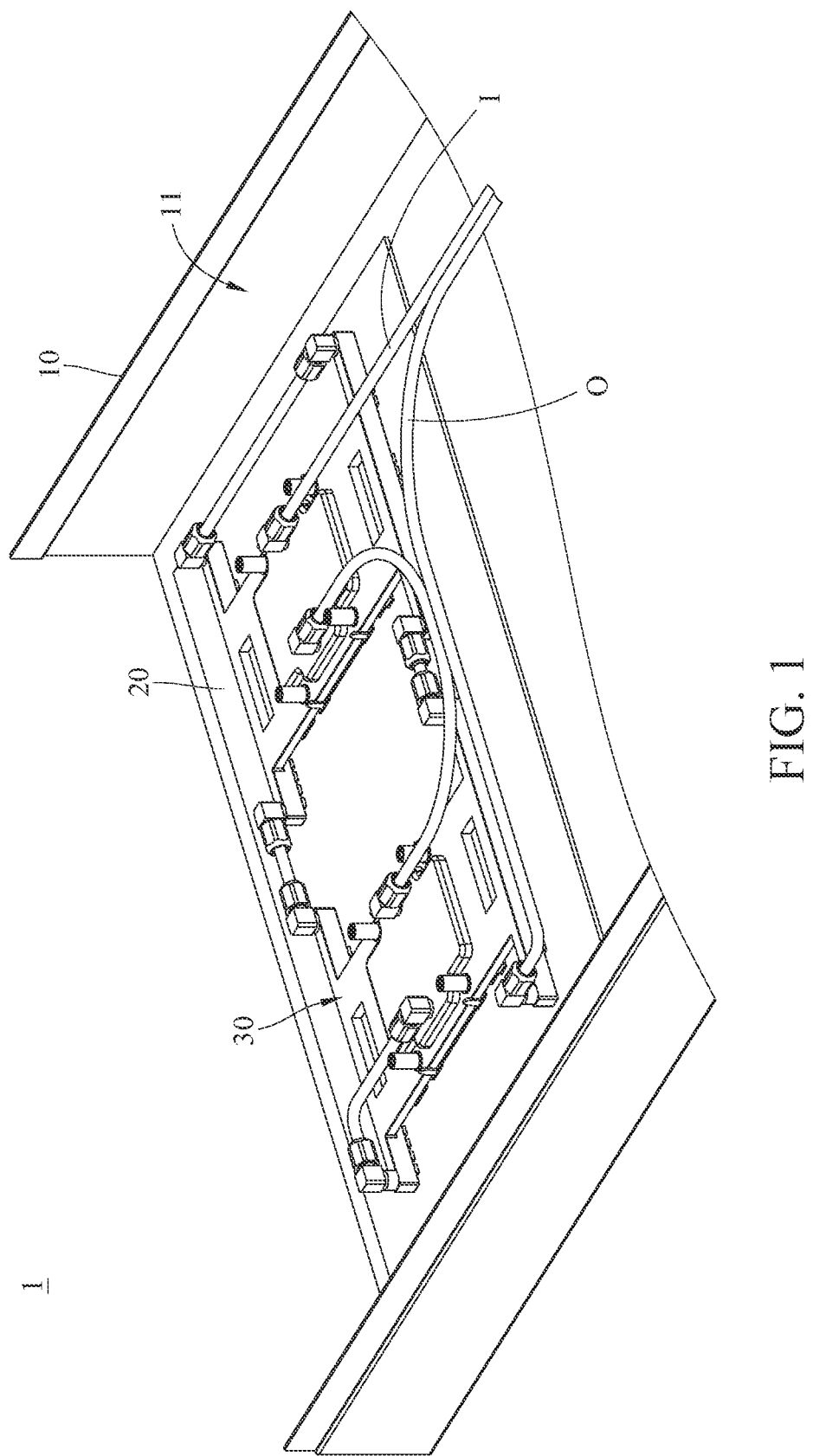
FIG. 1 is a partial perspective view of a server according to one embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present invention, such as technical and scientific terms, have its own meanings and can be comprehended by those skilled in the art, unless the terms are additionally defined in the present invention. That is, the terms used in the following paragraphs should be read on the meaning commonly used in the related fields and will not be overly explained, unless the terms have a specific meaning in the present invention.

Figure 2:
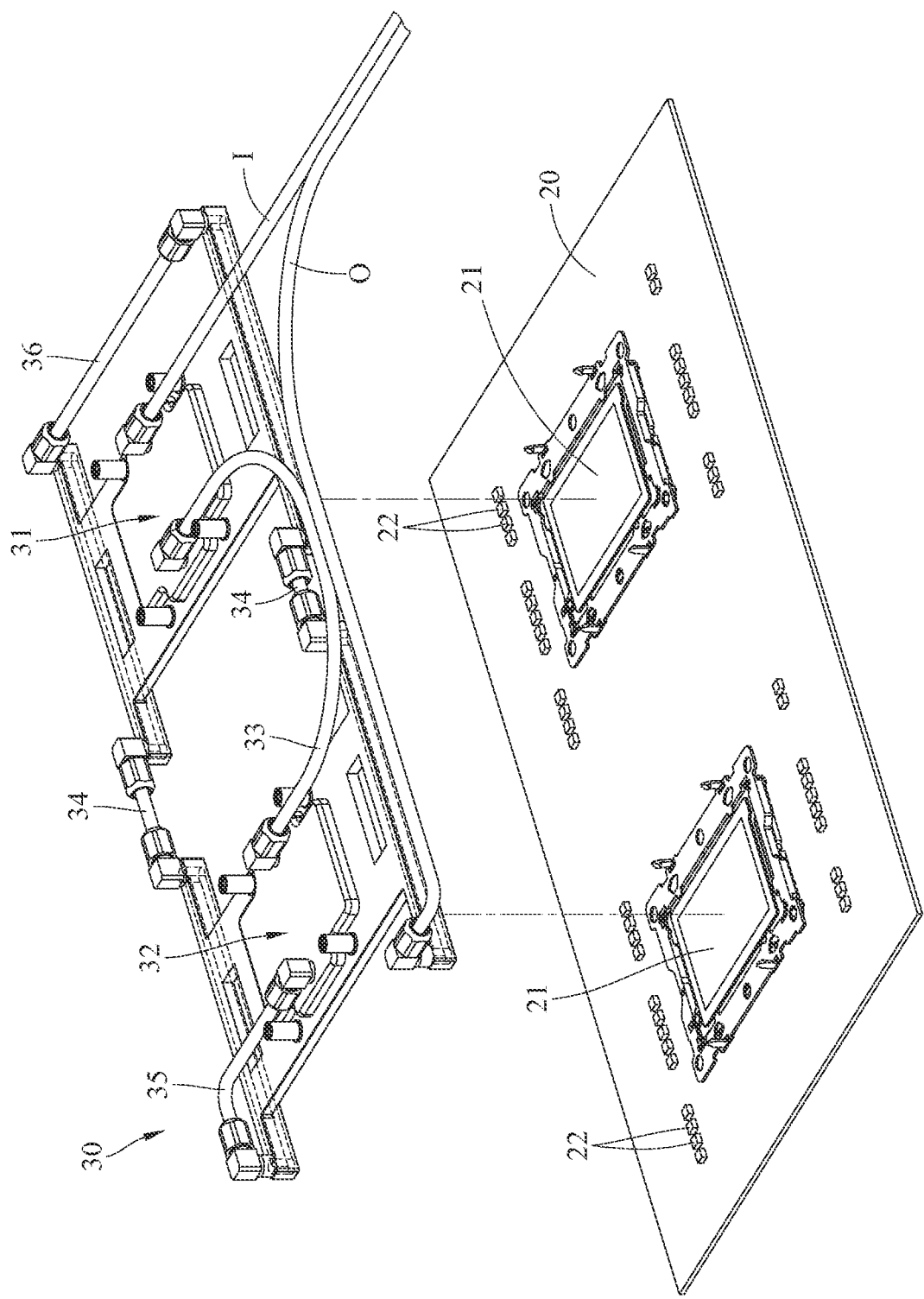
FIG. 2 is an exploded view of a liquid cooling plate assembly and a motherboard in FIG. 1.
Figure 3:
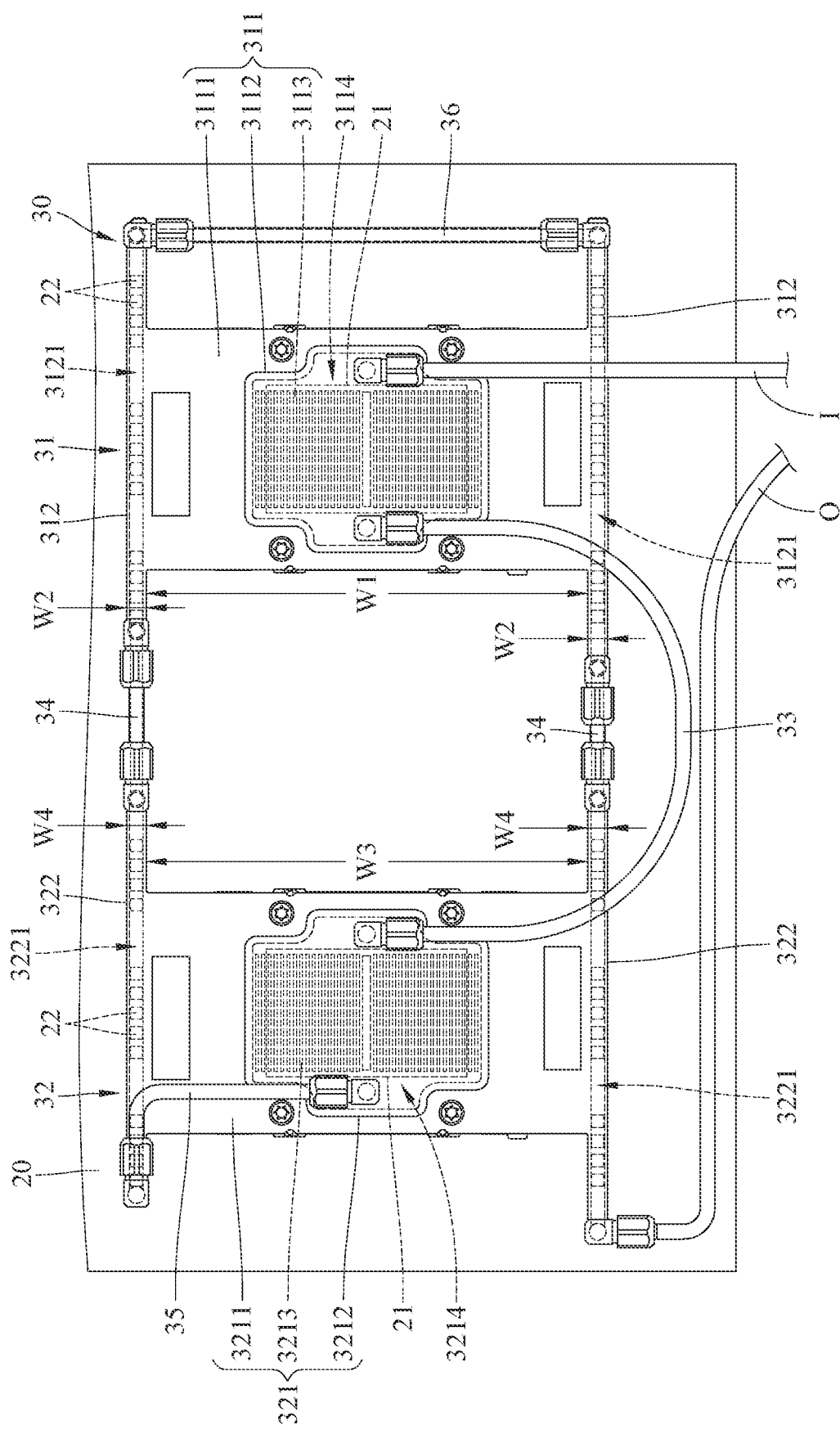
FIG. 3 is a top view of the liquid cooling plate assembly and the motherboard in FIG. 1.

Referring to FIGS. 1 to 3, FIG. 1 is a partial perspective view of a server 1 according to one embodiment of the invention, FIG. 2 is an exploded view of a liquid cooling plate assembly 30 and a motherboard 20 in FIG. 1, and FIG. 3 is a top view of the liquid cooling plate assembly 30 and the motherboard 20 in FIG. 1.

In this embodiment, the server 1 includes a casing 10, a motherboard 20 and a liquid cooling plate assembly 30. In addition, the server 1 may further include other components, such as hard disk drives, fans and a power supply. In order to clear show the structure of the liquid cooling plate assembly 30 of the server 1, the aforementioned components are omitted in the figures.

In this embodiment, the casing 10 has an accommodation space 11, and the motherboard 20 is located in the accommodation space 11. The motherboard 20 has a plurality of first heat sources 21 and a plurality of second heat sources 22. Specifically, the quantity of the first heat sources 21 is, for example, two, and the two first heat sources 21 are, for example, CPUs. The quantity of the second heat sources 22 are, for example, 46. The second heat sources 22 are, for example, voltage regulator chips (i.e., VR chips). The second heat sources 22 are located around the two first heat sources 21. For example, some of the second heat sources 22 are located at two opposite sides of one of the first heat sources 21, and the others of the second heat sources 22 are located at two opposite sides of the other one of the first heat sources 21.

The liquid cooling plate assembly 30 includes a first liquid cooling plate 31, a second liquid cooling plate 32, a first connection tube 33 and two second connection tubes 34. Moreover, the liquid cooling plate assembly 30 may further include a third connection tube 35 and a fourth connection tube 36.

The first liquid cooling plate 31 includes a first heat dissipation part 311 and two second heat dissipation parts 312. The first heat dissipation part 311 includes a first base 3111, a first cover 3112 and a plurality of first fins 3113. The first base 3111 is configured to be in thermal contact with one of the first heat sources 21 to absorb heat generated by the first heat source 21. The first cover 3112 is disposed on the first base 3111, and the first cover 3112 and the first base 3111 together form a first fluid chamber 3114. The first fins 3113 are disposed in the first fluid chamber 3114 and spaced apart from each other so as to form a three-dimensional skived channel in the first fluid chamber 3114 for increasing a contact area between a coolant (not shown) and the first heat dissipation part 311, thereby enhancing the efficiency of heat exchange therebetween. The two second heat dissipation parts 312 are respectively and integrally connected to two opposite sides of the first base 3111, a width W1 of the first heat dissipation part 311 is larger than widths W2 of the two second heat dissipation parts 312. The first heat dissipation part 311 and the two second heat dissipation parts 312 together form a I-shaped structure. The two second heat dissipation parts 312 are in thermal contact with some of the second heat sources 22 located at two opposite sides of one of the first heat sources 21, and each of the two second heat dissipation parts 312 has a first fluid channel 3121.

Note that the first fins 3113 are optional structures and may be provided or omitted according to the desired efficiency of heat exchange. Moreover, the first base 3111 and the first cover 3112 of the first heat dissipation part 311 are not restricted to being made of two pieces; in some other embodiment, the first cover and the first base of the first heat dissipation part may be made of a single piece.

The second liquid cooling plate 32 includes a third heat dissipation part 321 and two fourth heat dissipation parts 322. The third heat dissipation part 321 includes a second base 3211, a second cover 3212 and a plurality of second fins 3213. The second base 3211 is configured to be in thermal contact with the other one of the first heat sources 21 to absorb heat generated by this first heat source 21. The second cover 3212 is disposed on the second base 3211, and the second cover 3212 and the second base 3211 together form a second fluid chamber 3214. The second fins 3213 are disposed in the second fluid chamber 3214 and spaced apart from each other so as to form a three-dimensional skived channel in the second fluid chamber 3214 for increasing a contact area between a coolant and the third heat dissipation part 321, thereby enhancing the efficiency of heat exchange. The two fourth heat dissipation parts 322 are respectively and integrally connected to two opposite sides of the second base 3211, and a width W3 of the third heat dissipation part 321 is larger than widths W4 of the two fourth heat dissipation parts 322. The third heat dissipation part 321 and the two fourth heat dissipation parts 322 together form a I-shaped structure. The two fourth heat dissipation parts 322 are in thermal contact with others of the second heat sources 22 located at two opposite sides of the other one of the first heat sources 21, and each of the two fourth heat dissipation parts 322 has a second fluid channel 3221.

Note that the second fins 3213 are optional structures and may be provided or omitted according to the desired efficiency of heat exchange. Moreover, the second base 3211 and the second cover 3212 of the third heat dissipation part 321 are not restricted to being made of two pieces; in some other embodiment, the first cover and the first base of the first heat dissipation part may be made of a single piece.

Two opposite ends of the first connection tube 33 are respectively connected to the first cover 3112 of the first heat dissipation part 311 and the second cover 3212 of the third heat dissipation part 321 so as to communicate the first fluid chamber 3114 of the first heat dissipation part 311 with the second fluid chamber 3214 of the third heat dissipation part 321.

Two opposite ends of one of the second connection tubes 34 are respectively connected to one of the fourth heat dissipation parts 322 and one of the second heat dissipation parts 312 so as to communicate the second fluid channel 3221 of this fourth heat dissipation part 322 with the first fluid channel 3121 of this second heat dissipation part 312. Two opposite ends of the other one of the second connection tubes 34 are respectively connected to the other one of the fourth heat dissipation parts 322 and the other one of the second heat dissipation parts 312 so as to communicate the second fluid channel 3221 of this fourth heat dissipation part 322 with the first fluid channel 3121 of this second heat dissipation part 312.

Two opposite ends of the third connection tube 35 are respectively connected to the third heat dissipation part 321 and one of the fourth heat dissipation parts 322 so as to communicate the second fluid chamber 3214 of the third heat dissipation part 321 with the second fluid channel 3221 of this fourth heat dissipation part 322.

Two opposite ends of the fourth connection tube 36 are respectively connected to two ends of the two second heat dissipation parts 312 respectively located farther away from the two fourth heat dissipation parts 322 so as to communicate the two first fluid channels 3121 of the two second heat dissipation parts 312 with each other. The two second heat dissipation parts 312, the two fourth heat dissipation parts 322 and the fourth connection tube 36 together form a U-shaped structure.

In this embodiment, the first cover 3112 of the first heat dissipation part 311 is configured to be connected to an inlet tube I, and the fourth heat dissipation part 322 where the third connection tube 35 is not connected is configured to be connected to an outlet tube O. The inlet tube I, the liquid cooling plate assembly 30, the outlet tube O, a pump (not shown) and a radiator (not shown) may together form a loop for the circulation of the coolant. For example, the pump can drive the coolant to flow into the first fluid chamber 3114 of the first heat dissipation part 311 through the inlet tube I, such that the coolant can perform heat exchange with the first heat dissipation part 311 so as to take away the heat generated by one of the first heat sources 21. Then, the coolant flows into the second fluid chamber 3214 of the third heat dissipation part 321 through the first connection tube 33, such that the coolant can perform heat exchange with the third heat dissipation part 321 so as to take away the heat generated by the other one of the first heat sources 21. Then, the coolant flows into the second fluid channel 3221 of one of the fourth heat dissipation parts 322 through the third connection tube 35, and then the coolant sequentially flows through one of the second connection tubes 34, the first fluid channel 3121 of one of the second heat dissipation parts 312, the fourth connection tube 36, the first fluid channel 3121 of the other one of the second heat dissipation parts 312 and the second connection tube 34 and thus reaches the second fluid channel 3221 of the other one of the fourth heat dissipation parts 322, thereby taking away the heat generated by the second heat sources 22. Then, the coolant flows through the outlet tube O and reaches the radiator so as to be cooled. As a result, after the repetition of the aforementioned processes, the liquid cooling plate assembly 30 can effectively perform heat dissipation to the first heat sources 21 and the second heat sources 22 so as to meet the heat dissipation requirements of the first heat sources 21 and the second heat sources 22. Specifically, after the second heat sources 22 are cooled by the liquid cooling plate assembly 30, the temperatures of the second heat sources 22 fall within a range from 55.2° C. to 69.3° C., which are lower than the critical temperature (85° C.) of the second heat sources 22. In addition, a conventional means merely enables the temperatures of the second heat sources 22 to fall within a range from 57.1° C. to 76.1° C., and thus compare to the conventional means, the liquid cooling plate assembly 30 of this embodiment can further reduce the temperatures of the second heat sources 22.

In this embodiment, the second heat dissipation parts 312 are respectively and integrally connected to two opposite sides of the first base 3111, and the fourth heat dissipation parts 322 are respectively and integrally connected to two opposite sides of the second base 3211, which enables the first liquid cooling plate 31 and the second liquid cooling plate 32 to have sufficient structural strengths and reduces the manufacturing costs of the first liquid cooling plate 31 and the second liquid cooling plate 32.

Note that the second heat dissipation parts 312 are not restricted to being respectively and integrally connected to two opposite sides of the first base 3111, and the fourth heat dissipation parts 322 are not restricted to being respectively and integrally connected to two opposite sides of the second base 3211; in some other embodiments, the second heat dissipation parts may be respectively mounted to two opposite sides of the first base, and the fourth heat dissipation parts may be respectively mounted to two opposite sides of the second base.

In this embodiment, the first connection tube 33, the second connection tubes 34, the third connection tube 35 and the fourth connection tube 36 enable the fluid channels and the fluid chambers of the first liquid cooling plate 31 and the second liquid cooling plate 32 to be in fluid communication with one another, such that the liquid cooling plate assembly 30 can be applied in various and complex scenarios and thus suitable for different types of servers. In addition, the liquid cooling plate assembly 30 can be used in a hostile environment, and has high stability and long service life.

Note that the third connection tube 35 is an optional component; in some other embodiments, the third connection tube may be omitted, and the second fluid chamber of the third dissipation part may be in fluid communication with the second fluid channel of the fourth heat dissipation part via an interior channel of the second base.

Furthermore, the second heat sources 22 are not restricted to being located at two opposite sides of each of the first heat sources 21 of the motherboard 20; in some other embodiment, the second heat sources may be merely located at one side of each of the first heat sources of the motherboard. In such a case, the first liquid cooling plate may have only one second heat dissipation part, the second liquid cooling plate may have only one fourth heat dissipation part, the liquid cooling plate assembly may include only one second connection tube for connecting the second heat dissipation part with the fourth heat dissipation part, and the fourth connection tube may be omitted.

In this embodiment, the first liquid cooling plate 31 and the second liquid cooling plate 32 may be made of metal material, such as aluminum or copper, so as to have higher thermal conductivities for enhancing the heat dissipation efficiency of the liquid cooling plate assembly 30 to the first heat sources 21 and the second heat sources 22.

The aforementioned liquid cooling plate assembly 30 is not restricted to being applied in the server 1 and may be modified to be applied in another type of an electronic product.

According to the liquid cooling plate assembly and the server as discussed in the above embodiments, the coolant can flow through the first fluid chamber of the first heat dissipation part of the first liquid cooling plate, the second fluid chamber of the third heat dissipation part of the second liquid cooling plate, the second fluid channels of the fourth heat dissipation parts of the second liquid cooling plate, and the first fluid channels of the second heat dissipation parts of the first liquid cooling plate, such that the coolant can perform heat exchange with the first heat dissipation part and the second heat dissipation part which are respectively in thermal contact with the first heat sources so as to take away the heat generated by the first heat sources, and the coolant can perform heat exchange with the second heat dissipation parts and the fourth heat dissipation parts which are in thermal contact with the second heat sources so as to take away the heat generated by the second heat sources. As a result, the liquid cooling plate assembly can effectively and efficiently perform heat dissipation to the first heat sources and the second heat sources so as to achieve the heat dissipation requirements of the first heat sources and the second heat sources.

In addition, the first connection tube, the second connection tubes, the third connection tube and the fourth connection tube enable the fluid channels and the fluid chambers of the first liquid cooling plate and the second liquid cooling plate to be in fluid communication with one another, such that the liquid cooling plate assembly can be applied in various and complex scenarios and thus suitable for different types of servers.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A liquid cooling plate assembly, configured to be in thermal contact with two first heat sources and a plurality of second heat sources, the liquid cooling plate assembly comprising:
    a first liquid cooling plate, comprising:
        a first heat dissipation part, configured to be in thermal contact with one of the two first heat sources and having a first fluid chamber; and
        at least one second heat dissipation part, integrally connected to the first heat dissipation part and configured to be in thermal contact with some of the plurality of second heat sources, wherein the at least one second heat dissipation part has at least one first fluid channel;
    a second liquid cooling plate separated from the first liquid cooling plate, the second liquid cooling plate comprising:
        a third heat dissipation part, configured to be in thermal contact with another one of the first heat sources and having a second fluid chamber; and
        at least one fourth heat dissipation part, integrally connected to the third heat dissipation part and configured to be in thermal contact with others of the plurality of second heat sources, wherein the at least one fourth heat dissipation part has at least one second fluid channel, and the at least one second fluid channel is in fluid communication with the second fluid chamber;
    a first connection tube, connected to the third heat dissipation part and the first heat dissipation part so as to communicate the second fluid chamber with the first fluid chamber; and
    at least one second connection tube connected to the at least one fourth heat dissipation part and the at least one second heat dissipation part so as to communicate the at least one second fluid channel with the at least one first fluid channel,
    wherein the liquid cooling plate assembly is configured with a coolant flow path that flows sequentially flows through the first fluid chamber of the first heat dissipation portion, the first connection tube, the second fluid chamber of the third heat dissipation portion, one of the at least one second fluid channel of the at least one fourth heat dissipation portion, one of the at least one second connection tube, and one of the at least one fourth fluid channel of the at least one second heat dissipation portion.

2. The liquid cooling plate assembly according to claim 1, further comprising a third connection tube, wherein the third connection tube is connected to the third heat dissipation part and the at least one fourth heat dissipation part so as to communicate with the second fluid chamber with the at least one second fluid channel.

3. The liquid cooling plate assembly according to claim 2, further comprising a fourth connection tube, wherein:
    the at least one second heat dissipation part is two second heat dissipation parts,
    the at least one fourth heat dissipation part is two fourth heat dissipation parts,
    the at least one first fluid channel is two first fluid channels,
    the at least one second fluid channel is two second fluid channels,
    the at least one second connection tube is two second connection tubes,
    each of the two second heat dissipation parts having one of the two first fluid channels, each of the two second heat dissipation parts are respectively connected to two opposite sides of the first heat dissipation part,
    each of the two fourth heat dissipation parts has one of the two second fluid channels, each of the two fourth heat dissipation parts is connected to a respective opposite side of the third heat dissipation part,
    each of the two second connection tubes connects one of the two second heat dissipation parts to one of the two fourth heat dissipation parts so as to communicate the one of the two first fluid channels of the two second heat dissipation parts with the one of the two second fluid channels of the two fourth heat dissipation parts,
    the third connection tube is connected to one of the two fourth heat dissipation parts, and
    each opposite end of the fourth connection tube is connected to a respective end of the two second heat dissipation parts that is located farther away from the two fourth heat dissipation parts so as to communicate the two first fluid channels of the two second heat dissipation parts with each other.

4. The liquid cooling plate assembly according to claim 3, wherein:
    the first heat dissipation part and the two second heat dissipation parts together form an I-shaped structure,
    the third heat dissipation part and the two fourth heat dissipation parts together form an I-shaped structure, and
    the two second heat dissipation parts, the two fourth heat dissipation parts and the fourth connection tube together form a U-shaped structure.

5. The liquid cooling plate assembly according to claim 1, wherein a width of the first heat dissipation part is larger than a width of the at least one second heat dissipation part, and a width of the third heat dissipation part is larger than a width of the at least one fourth heat dissipation part.

6. The liquid cooling plate assembly according to claim 1, wherein;

the first heat dissipation part comprises a first base, a first cover and a plurality of first fins, the first base is connected to the at least one second heat dissipation part, the first cover is disposed on the first base, the first cover and the first base together form the first fluid chamber, and the plurality of first fins are disposed in the first fluid chamber and spaced apart from one another, and the third heat dissipation part comprises a second base, a second cover and a plurality of second fins, the second base is connected to the at least one fourth heat dissipation part, the second cover is disposed on the second base, the second cover and the second base together form the second fluid chamber, and the plurality of second fins are disposed in the second fluid chamber and spaced apart from one another.

7. A server, comprising:
a casing, having an accommodation space;
a motherboard, located in the accommodation space and having two first heat sources and a plurality of second heat sources; and
a liquid cooling plate assembly, comprising:
  a first liquid cooling plate, comprising:
    a first heat dissipation part, in thermal contact with one of the two first heat sources and having a first fluid chamber; and
    at least one second heat dissipation part, integrally connected to the first heat dissipation part and in thermal contact with some of the plurality of second heat sources, wherein the at least one second heat dissipation part has at least one first fluid channel;
  a second liquid cooling plate separated from the first liquid cooling plate, the second liquid cooling plate comprising:
    a third heat dissipation part, in thermal contact with another one of the two first heat sources and having a second fluid chamber; and
    at least one fourth heat dissipation part, integrally connected to the third heat dissipation part and in thermal contact with others of the plurality of second heat sources, wherein each of the at least one fourth heat dissipation part has a at least one second fluid channel, and the at least one second fluid channel is in fluid communication with the second fluid chamber;
  a first connection tube, connected to the third heat dissipation part and the first heat dissipation part so as to communicate the second fluid chamber with the first fluid chamber; and
  at least one second connection tube connected to at least one fourth heat dissipation part and the at least one second heat dissipation part so as to communicate the at least one second fluid channel with the at least one first fluid channel,
  wherein the liquid cooling plate assembly is configured with a coolant flow path that flows sequentially flows through the first fluid chamber of the first heat dissipation portion, the first connection tube, the second fluid chamber of the third heat dissipation portion, one of the at least one second fluid channel of the at least one fourth heat dissipation portion, one of the at least one second connection tube, and one of the at least one fourth fluid channel of the at least one second heat dissipation portion.

8. The server according to claim 7, wherein the liquid cooling plate assembly further comprises a third connection tube, the third connection tube is connected to the third heat dissipation part and the at least one fourth heat dissipation part so as to communicate with the second fluid chamber with the at least one second fluid channel.

9. The server according to claim 8, wherein the liquid cooling plate assembly further comprises a fourth connection tube, wherein:
  the at least one second heat dissipation part is two second heat dissipation parts,
  the at least one fourth heat dissipation part is two fourth heat dissipation parts,
  the at least one first fluid channel is two first fluid channels,
  the at least one second fluid channel is two second fluid channels,
  the at least one second connection tube is two second connection tubes,
  each of the two second heat dissipation parts having one of the two first fluid channels, each of the two second heat dissipation parts are respectively connected to two opposite sides of the first heat dissipation part,
  each of the two fourth heat dissipation parts has one of the two second fluid channels, each of the two fourth heat dissipation parts is connected to a respective opposite side of the third heat dissipation part,
  each of the two second connection tubes connects one of the two second heat dissipation parts to one of the two fourth heat dissipation parts so as to communicate the one of the two first fluid channels of the two second heat dissipation parts with the one of the two second fluid channels of the two fourth heat dissipation parts,
  the third connection tube is connected to one of the two fourth heat dissipation parts, and
  each opposite end of the fourth connection tube is connected to a respective end of the two second heat dissipation parts that is located farther away from the two fourth heat dissipation parts so as to communicate the two first fluid channels of the two second heat dissipation parts with each other.

10. The server according to claim 7, wherein a width of the first heat dissipation part is larger than a width of the at least one second heat dissipation part, and a width of the third heat dissipation part is larger than a width of the at least one fourth heat dissipation part.

* * * * *